United States Patent
Kitamura et al.

(10) Patent No.: US 8,114,703 B2
(45) Date of Patent: Feb. 14, 2012

(54) ORGANIC EL DEVICE

(75) Inventors: Kazuki Kitamura, Ishikawa-gun (JP); Tetsuo Ishida, Kanazawa (JP)

(73) Assignee: Toshiba Mobile Display Co., Ltd., Fukaya-shi (JP)

( * ) Notice: Subject to any disclaimer, the term of this patent is extended or adjusted under 35 U.S.C. 154(b) by 0 days.

(21) Appl. No.: 12/917,866

(22) Filed: Nov. 2, 2010

(65) Prior Publication Data

US 2011/0117688 A1 May 19, 2011

(30) Foreign Application Priority Data

Nov. 19, 2009 (JP) ................. 2009-264214

(51) Int. Cl.
*H01L 21/00* (2006.01)
*H01L 51/40* (2006.01)

(52) U.S. Cl. ............. 438/82; 438/22; 438/46; 438/48; 438/69; 438/99; 257/E21.002; 257/E21.299; 257/E21.527; 257/E31.095; 257/E51.022

(58) Field of Classification Search ........... 257/E21.002, 257/E21.299, E21.527, E31.095, E51.022
See application file for complete search history.

(56) References Cited

U.S. PATENT DOCUMENTS

| | | | |
|---|---|---|---|
| 7,288,285 B2 | 10/2007 | Long et al. | |
| 2006/0062920 A1 | 3/2006 | Long et al. | |
| 2006/0177576 A1 | 8/2006 | Long et al. | |
| 2006/0251811 A1 | 11/2006 | Long et al. | |
| 2007/0098891 A1 | 5/2007 | Tyan et al. | |
| 2007/0104864 A1 | 5/2007 | Boroson et al. | |
| 2007/0163497 A1 | 7/2007 | Grace et al. | |
| 2007/0248753 A1 | 10/2007 | Tyan et al. | |
| 2009/0033229 A1* | 2/2009 | Kanamori et al. | ............. 315/151 |
| 2010/0084648 A1* | 4/2010 | Watanabe | ....................... 257/43 |

FOREIGN PATENT DOCUMENTS

| | | |
|---|---|---|
| JP | 2000-164356 | 6/2000 |
| JP | 2003-68465 | 3/2003 |
| JP | 2003-157973 | 5/2003 |
| JP | 2004-228088 | 8/2004 |
| JP | 2009-84663 | 4/2009 |

OTHER PUBLICATIONS

U.S. Appl. No. 13/041,813, filed Mar. 7, 2011, Kitamura, et al.
Office Action issued Oct. 4, 2011 in Japanese Application No. 2009-264214 filed Nov. 19, 2009 (w/English translation).

* cited by examiner

*Primary Examiner* — Mohsen Ahmadi
(74) *Attorney, Agent, or Firm* — Oblon, Spivak, McClelland, Maier & Neustadt, L.L.P.

(57) ABSTRACT

According to one embodiment, a method of manufacturing an organic EL device includes providing a structure including a substrate and an electrode positioned above the substrate, and forming an organic layer including a mixture of first and second organic materials above the electrode. The first organic material has a first sublimation point. The second organic material has a second sublimation point higher than the first sublimation point. The formation of the organic layer includes heating an evaporation material including a mixture of the first and second organic materials to an evaporation temperature so as to sublimate the first and second organic materials, and delivering the sublimed first and second organic materials toward the electrode to deposit a mixture including the first and second organic materials above the electrode. The evaporation temperature is, for example, a temperature higher than the second sublimation temperature by 50° C. or more.

20 Claims, 3 Drawing Sheets

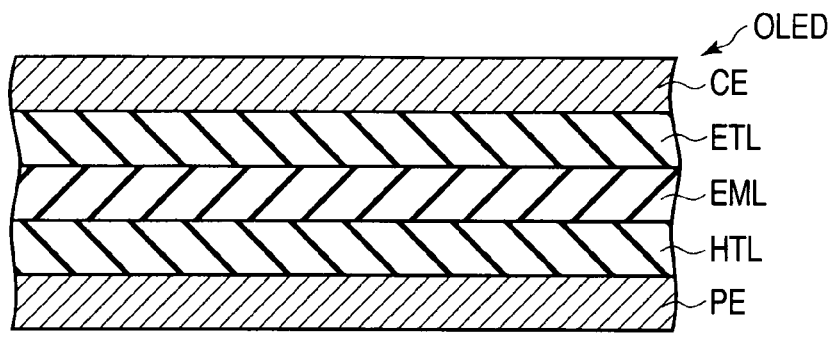
F I G. 1
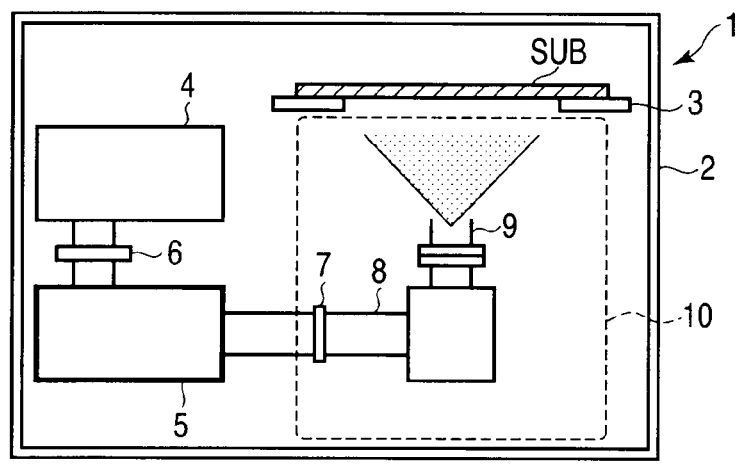
F I G. 2
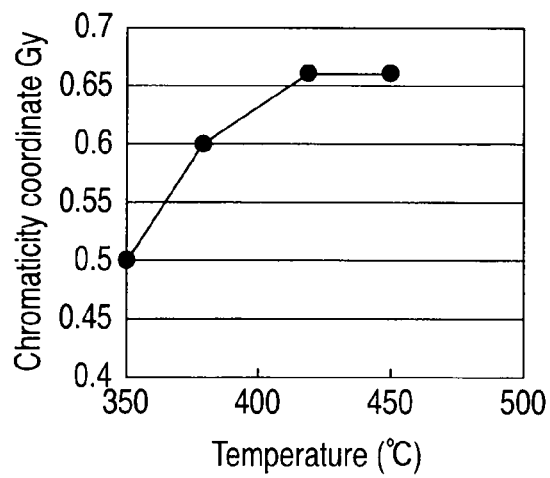
F I G. 3

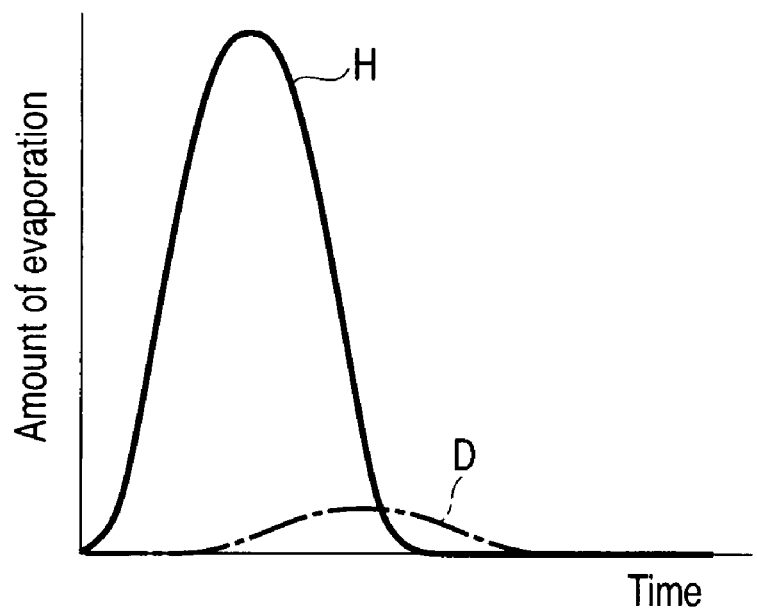
F I G. 4
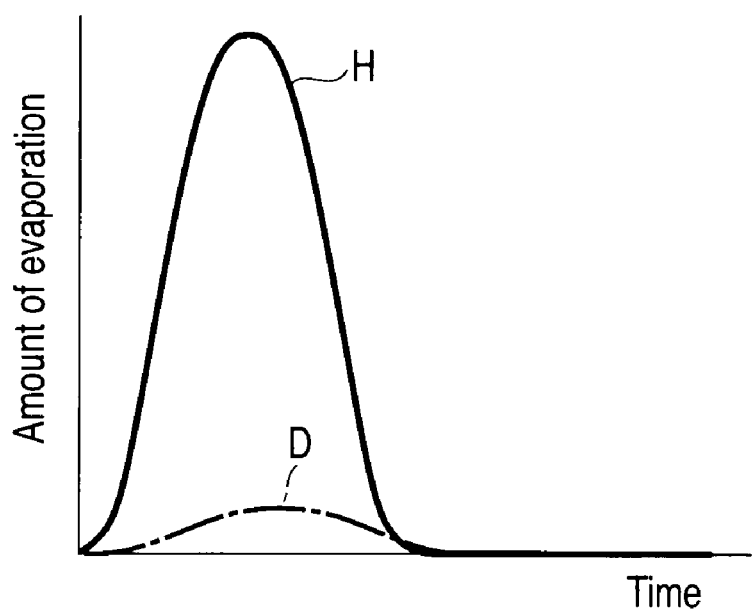
F I G. 5

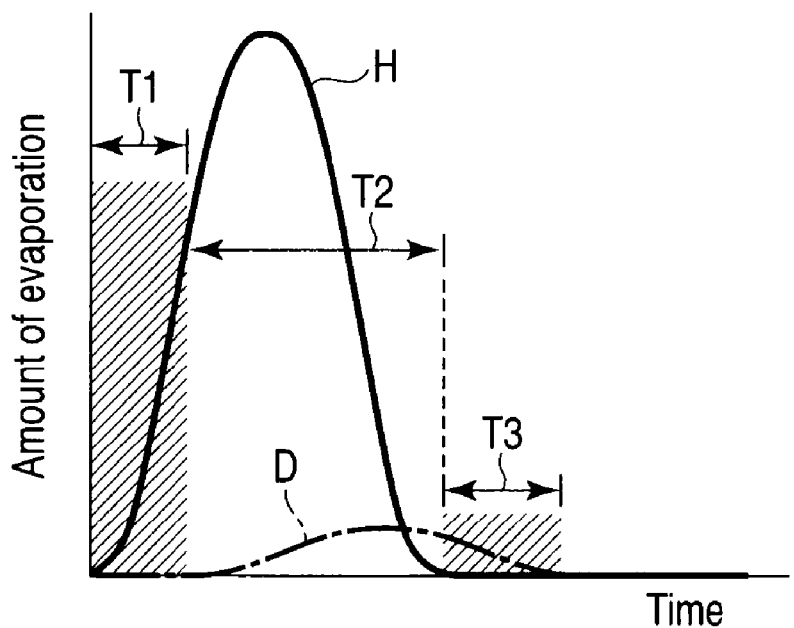
F I G. 6
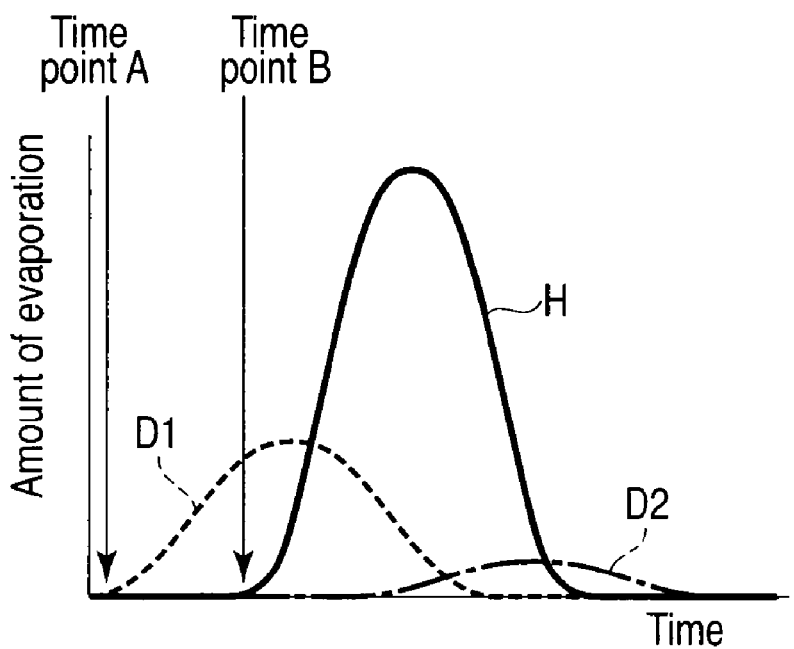
F I G. 7

ORGANIC EL DEVICE

CROSS-REFERENCE TO RELATED APPLICATION

This application is based upon and claims the benefit of priority from Japanese Patent Application No. 2009-264214, filed Nov. 19, 2009; the entire contents of which are incorporated herein by reference.

FIELD

Embodiments described herein relate generally to a method of manufacturing an organic electroluminescence (hereinafter referred to as EL) device.

BACKGROUND

In recent years, displays including organic EL elements as display elements have been studied actively. Since an organic EL element is a light-emitting element, no backlight is necessary in such a display. For this reason, an organic EL display can be manufactured to have a thinner profile and a lighter weight as compared to a liquid crystal display. Also, an organic EL display has advantages over a liquid crystal display in achieving a high response speed, a wide viewing angle and a high contrast.

An organic EL display capable of displaying a full color image includes pixels which emit, for example, red, green and blue light. In the manufacture of such a display, emitting layers whose emission spectra differ from one another are formed in specific patterns corresponding to arrangements of pixels which emit red, green and blue light. For example, an emitting layer which emits red light is formed by vacuum evaporation using a fine mask provided with through-holes which correspond to the pixels emitting red light. Then, similar processes are repeated so as to form emitting layers emitting green and blue light.

BRIEF DESCRIPTION OF THE DRAWINGS

FIG. 1 is a sectional view schematically showing an organic EL element of an organic EL device which can be manufactured by a method according to an embodiment;

FIG. 2 is a view schematically showing an example of a manufacturing apparatus which can be utilized for manufacturing the organic EL device;

FIG. 3 is a graph showing an example of a relationship between temperatures at which an evaporation material is heated and luminescent colors of organic EL elements;

FIG. 4 is a graph showing an example of changes in amounts of the sublimed host material and dopant with respect to time when a mixture of the host material and the dopant is heated;

FIG. 5 is a graph showing another example of changes in amounts of the sublimed host material and dopant with respect to time when a mixture of the host material and the dopant is heated;

FIG. 6 is a graph showing an example of timing to close and open a valve, which controls supply of a vaporized evaporation material; and FIG. 7 is a graph showing an example of changes in amounts of the sublimed host material and dopant with respect to time when the dopant and a mixture of the host material and the dopant are heated in this order.

DETAILED DESCRIPTION

In general, according to one embodiment, provided is a method of manufacturing an organic EL device, comprising providing a structure including a substrate and an electrode positioned above the substrate; and forming an organic layer including a mixture of first and second organic materials above the electrode, the first organic material having a first sublimation point SP1, the second organic material having a second sublimation point SP2 higher than the first sublimation point SP1, and the formation of the organic layer comprising heating an evaporation material including a mixture of the first and second organic materials to an evaporation temperature so as to sublimate the first and second organic materials, the evaporation temperature being one of first to third temperatures, the first temperature being a temperature higher than the second sublimation temperature SP2 by 50° C. or more, the second temperature being equal to or higher than a sum of the first sublimation temperature SP1 and a product of 150/370 and the first sublimation temperature SP1, and the third temperature being equal to or higher than a sum of the second sublimation temperature SP2 and a product of 50/370 and the second sublimation temperature SP2, and delivering the sublimed first and second organic materials toward the electrode to deposit a mixture including the first and second organic materials above the electrode.

Another embodiment provides a method of manufacturing an organic EL device, comprising providing a structure including a substrate and an electrode positioned above the substrate, and forming an organic layer including a mixture of first and second organic materials above the electrode, the first organic material having a first sublimation point SP1, the second organic material having a second sublimation point SP2 higher than the first sublimation point SP1, and the formation of the organic layer comprising supplying an evaporation material including a mixture of the first and second organic materials into a heating chamber, heating the evaporation material in the heating chamber to sublimate the first and second organic materials, keeping a flow of gas from the heating chamber toward the electrode shut off during a period after starting the supplying of the evaporation material into the heating chamber and before the sublimation of the second organic material starts, and delivering the sublimed first and second organic materials toward the electrode after the sublimation of the second organic material in the heating chamber starts so as to deposit a mixture including the first and second organic materials above the electrode.

Still another embodiment provides a method of manufacturing an organic EL device, comprising providing a structure including a substrate and an electrode positioned above the substrate, and forming an organic layer including a mixture of first and second organic materials above the electrode, the first organic material having a first sublimation point SP1, the second organic material having a second sublimation point SP2 higher than the first sublimation point SP1, and the formation of the organic layer comprising supplying an evaporation material including a mixture of the first and second organic materials into a heating chamber, heating the evaporation material in the heating chamber to sublimate the first and second organic materials, and delivering the sublimed first and second organic materials toward the electrode so as to deposit a mixture including the first and second organic materials above the electrode, wherein the supplying of the evaporation material into the heating chamber includes supplying a first evaporation material into the heating chamber, the first evaporation material including the second organic material and optionally the first organic material, and thereafter supplying a second evaporation material into the heating chamber, the second evaporation material including the first and second materials, the second evaporation material having a concentration of the first organic material higher than that of the first evaporation material.

Some embodiments are described below with reference to drawings. In the drawings, the same reference symbols denote components having the same or similar functions and duplicate descriptions will be omitted.

Organic EL devices described herein are, for example, organic EL displays, organic EL lighting apparatuses or organic EL printer heads. The EL devices may be top emission type-devices or bottom emission-type devices.

Each of the organic EL devices includes one or more organic EL elements. FIG. 1 shows an example of the organic EL element.

The organic EL element OLED shown in FIG. 1 includes a first electrode PE, a hole-transporting layer HTL, an emitting layer EML, an electron-transporting layer ETL and a second electrode CE. The first electrode PE, the hole-transporting layer HTL, the emitting layer EML, the electron-transporting layer ETL and the second electrode CE are stacked in this order.

The first electrode PE is, for example, an anode. In the case where the organic EL device is an active matrix device, the first electrode PE is a pixel electrode.

The first electrode PE is, for example, a reflecting or transmitting layer having a single layer structure. Alternatively, the first electrode PE may have a multilayered structure, for example, a two-layer structure including a reflecting layer and a transmitting layer thereon.

The reflecting layer is made of, for example, an electro-conductive material having a light-reflecting property such as silver (Ag) or aluminum (Al). The transmitting layer is made of, for example, an electro-conductive material having a light-transmitting property. As the electro-conductive material having a light-transmitting property, an electro-conductive oxide having a light-transmitting property such as indium tin oxide (ITO) or indium zinc oxide (IZO) can be used.

The hole-transporting layer HTL, the emitting layer EML and the electron-transporting layer ETL are made of organic materials. The emitting layer EML is made of a mixture including organic materials. The emitting layer EML includes, for example, a dopant and a host material. The emitting layer EML may include a fluorescence material or a phosphorescence material.

The second electrode CE is, for example, a cathode. The second electrode CE is a counter electrode facing the first electrode PE. In the case where the organic EL device is an active matrix device, the second electrode CE is a common electrode facing the first electrodes PE.

The second electrode CE is, for example, a transmitting or semi-transmitting layer having a single layer structure. Alternatively, the second electrode CE is a transmitting or semi-transparent layer having a multilayered structure. The multilayered second electrode CE includes, for example, a semi-transparent layer and a transmitting layer. As the material of the transmitting layer, the same materials as those described for the transmitting layer of the first electrode PE can be used. The semi-transparent layer is made of, for example, an electro-conductive material such as magnesium (Mg) or silver (Ag). The semi-transparent layer should be sufficiently thin to exhibit a light-transmitting property.

The organic EL element OLED may further include other layers. For example, the organic EL element OLED may further include a hole injection layer between the first electrode PE and the hole-transporting layer HTL. Alternatively, the organic EL element OLED may further include an electron injection layer between the electron-transporting layer ETL and the second electrode CE. One or both of the hole-transporting layer HTL and the electron-transporting layer ETL may be omitted.

Next, a production apparatus for manufacturing the organic EL device will be described below. To be more specific, a production apparatus available for forming the emitting layer EML will be described.

The production apparatus 1 shown in FIG. 2 includes a chamber 2, a holder 3, a feeder 4, a heating chamber 5, a shutter 6, a valve 7, a conduit 8 and a nozzle 9.

The chamber 2 is a vacuum chamber. The holder 3, the feeder 4, the heating chamber 5, the shutter 6, the valve 7, the conduit 8 and the nozzle 9 are arranged in the chamber 2. The feeder 4 may be placed outside the chamber 2.

The feeder 4 is charged with an evaporation material. The feeder 4 feeds the heating chamber 5 with the evaporation material.

The evaporation material includes a mixture of a first organic material having a first sublimation point SP1 and a second organic material having a second sublimation point SP2 higher than the first sublimation point SP1. In this embodiment, the first organic material is a host material, while the second organic material is a dopant. Typically, the evaporation material is in a form of particles, for example, powder.

The heating chamber 5 is spaced apart from the space 10 below the substrate SUB and includes inlet and outlet ports. The evaporation material from the feeder 4 is supplied into the heating chamber 5 through the inlet port.

The heating chamber 5 is equipped with a heater. The heater heats the evaporation material supplied into the heating chamber 5 to sublimate the first and second organic materials. The sublimed first and second organic materials are discharged out of the heating chamber 5 through the outlet port.

The shutter 6 is interposed between the feeder 4 and the inlet port of the heating chamber 5. The shutter 6 controls the supply of the evaporation material from the feeder 4 into the heating chamber 5 by its opening and shutting operations. In the case where the feeder 4 is placed outside the chamber 2, the shutter 6 may be placed inside or outside the chamber 2.

The valve 7 is interposed between the outlet port of the heating chamber 5 and the nozzle 9. The valve 7 controls the supply of the sublimed first and second organic materials from the heating chamber 5 to the nozzle 9 by its closing and opening operations.

The nozzle 9 is placed below the substrate SUB. Typically, the relative position of the nozzle 9 with respect to the substrate is fixed at least during the period of the vapor deposition.

The sublimed first and second organic materials are supplied from the heating chamber 5 through the valve 7 and the conduit 8 into the nozzle 9. The nozzle 9 ejects the sublimed first and second organic materials toward the underside of the substrate SUB. The ejected first and second organic materials are deposited on the substrate SUB to form a layer including a mixture of the first and second organic materials, which is the emitting layer EML in this embodiment.

Next, the first to third manufacturing methods utilizing the production apparatus 1 will be described. In the following manufacturing methods, it is supposed that the first organic material has a sublimation point SP1 of 270° C., while the second organic material has a sublimation point SP2 of 370° C.

In the first manufacturing method, a substrate SUB on which electrodes PE and a hole-transporting layer are formed is prepared. The substrate SUB is held by the holder 3 with the hole-transporting layer face-down.

Then, the shutter 6 is opened to supply the evaporation material from the feeder 4 into the heating chamber 5. The shutter 6 is closed, for example, after a predetermined amount of the evaporation material is supplied from the feeder 4 to the heating chamber 5.

In the heating chamber 5, the evaporation material is heated, for example, to the evaporation temperature described below.

The evaporation temperature is one of the first to third temperatures. The first temperature is a temperature higher than the sublimation point SP2 by 50° C. or more. The second temperature is equal to or higher than the sum of the sublimation temperature SP1 and the product of 150/370 and the sublimation temperature SP1. The third temperature is equal to or higher than the sum of the sublimation temperature SP2 and the product of 50/370 and the sublimation temperature SP2. That is, the first to third temperatures satisfy the following relationships.

1st temperature$\geq$SP2+50° C.

2nd temperature$\geq$SP1+150/370×SP1

3rd temperature$\geq$SP2+50/370×SP2

When the evaporation material is heated under such conditions, the first and second organic materials sublime almost simultaneously in spite of the fact that they have different sublimation points SP1 and SP2 as will be described later. Therefore, a mixture of the sublimed first and second organic materials is discharged out of the heating chamber 5.

The mixture of the first and second organic materials discharged out of the heating chamber 5 is fed to the nozzle 9 through the valve 7 and the conduit 8. The nozzle 9 ejects the sublimed first and second organic materials toward the underside of the substrate SUB. The first and second organic materials supplied to the substrate SUB are deposited thereon. Thus, the emitting layer EML is obtained.

Then, an electron-transporting layer ETL and an electrode CE are formed on the emitting layer EML in this order. Subsequently, downstream operations such as sealing are performed as necessary. An organic EL device is manufactured as described above.

Conventionally, an emitting layer has been formed, for example, by arranging a first gutter-shaped crucible filled with a dopant and a second gutter-shaped crucible filled with a host material such that the crucibles face the underside of a substrate and moving the first and second crucibles in the width direction thereof while heating the dopant and the host material. The first and second crucibles contain the dopant and the host material in amounts sufficient for forming a large number of emitting layers, respectively. Thus, in this method, the dopant and the host material sublime during the waiting period between the film-forming periods. Further, in this method, in order to evenly sublime the materials over the length of the crucibles, the first and second crucibles should contain sufficient amounts of dopant and host material, respectively. That is, in the case where the dopant and the host material cannot sublime evenly, the first and second crucibles should be replaced with unused first and second crucibles filled with the dopant and the host material, respectively, even if substantial amounts of dopant and host material remain. For these reasons, about 50% of the dopant and the host material has been wasted.

In the method described with reference to FIG. 2, a loss of the evaporation material during the waiting period can be minimized, for example, when the supply of the evaporation material from the feeder 4 into the heating chamber 5 is brought into sync with the film-formation. Also, this method does not suffer the loss of the evaporation material incident to the use of a crucible. Therefore, this method is advantageous in reducing the manufacturing cost of an organic EL device.

As described above, the method described with reference to FIG. 2 is advantageous in terms of the manufacturing cost. In this method, however, since a mixture of the host material and the dopant is used as the evaporation material, it is impossible to sublimate the host material at its optimum temperature, while sublimating the dopant at its optimum temperature, in contrast to the case of using two crucibles. Therefore, it is possible that the dopant, etc. unevenly distributes in the emitting layer EML. In this case, the electron-hole injection balance cannot be optimized, thus a high luminous efficiency cannot be achieved.

In the present embodiment, the evaporation material is heated to the above-described evaporation temperature. This makes it possible to almost simultaneously sublimate the host material and the dopant. Accordingly, the dopant can evenly distribute in the emitting layer EML, and the electron-hole injection balance can be optimized. Therefore, a high luminous efficiency can be achieved.

The evaporation temperature, that is, the heating temperature in the heating chamber 5 will be described below.

Luminous colors were measured for organic EL elements OLED whose emitting layers EML were formed using the production apparatus 1 described with reference to FIG. 2. Here, as the material of the emitting layer EML, used was a particulate evaporation material, to be more specific, a mixture of a host material having a sublimation point SP1 of 270° C. and a dopant having a sublimation point SP2 of 370° C. Note that the dopant used was a fluorescence material which emitted light having a dominant wavelength within a green wavelength range. The results are shown in FIG. 3.

In FIG. 3, the abscissa represents the heating temperatures in Celsius degree, while the ordinate represents the chromaticity coordinates Gy of the luminous colors of the organic EL elements OLED. Note that the chromaticity coordinate Gy is the y-coordinate in the x,y chromaticity diagram.

As shown in FIG. 3, in the case where the heating temperature was about 350° C., the chromaticity coordinate Gy was about 0.5. In the case where the heating temperature was about 380° C., the chromaticity coordinate Gy was about 0.6. In the case where the heating temperature was about 420° C., the chromaticity coordinate Gy was about 0.66. In the case where the heating temperature was about 450° C., the chromaticity coordinate Gy was about 0.66.

As shown herein, in the case where the heating temperature was set equal to or lower than about 380° C., a desirable chromaticity could not be achieved. On the other hand, in the case where the heating temperature was set higher than the sublimation point SP2 by 50° C. or more, a desirable chromaticity could be achieved.

FIG. 4 is a graph showing an example of changes in amounts of the sublimed host material and dopant with respect to time in the case where the heating temperature is not sufficiently higher than the sublimation point of the dopant. FIG. 5 is a graph showing an example of changes in amounts of the sublimed host material and dopant with respect to time in the case where the heating temperature is sufficiently higher than the sublimation point of the dopant. In FIGS. 4 and 5, the curve H indicates the amount of the sublimed host material, while the curve D indicates the amount of the sublimed dopant.

In general, a dopant has a molecular weight greater than that of a host material. Thus, the sublimation point SP2 of the dopant is higher than the sublimation point SP1 of the host material. Accordingly, in the case where the heating temperature is not sufficiently higher than the sublimation point SP2 of the dopant, the start of the sublimation of the dopant lags behind the start of the sublimation of the host material as shown in FIG. 4. Since the sublimation of the dopant lags behind the sublimation of the host material, a part of the dopant remains unsublimed after the host material supplied into the heating chamber sublimes completely. Thus, after the sublimation of the host material is finished, only the dopant sublimes.

For these reasons, in the case where the sublimation progresses as shown in FIG. 4, the emitting layer EML thus obtained will have a distribution of the dopant in which the concentration of the dopant increases from the hole-transporting layer's side toward the electron-transporting layer's side. In addition, the region of the emitting layer EML near the electron-transporting layer ETL will be composed mainly of the dopant. Therefore, the electron-hole injection balance cannot be optimized, and a high luminous efficiency cannot be achieved.

In the case where the heating temperature is sufficiently high as compared with the sublimation point SP2 of the dopant, the sublimation of the dopant starts almost simultaneous with the start of the sublimation of the host material as shown in FIG. 5. Thus, the sublimation of the dopant can be completed almost simultaneously with the completion of the sublimation of the host material. Therefore, an emitting layer EML having a uniform composition can be obtained. That is, the electron-hole injection balance can be optimized, and a high luminous efficiency can be achieved.

In the example described above, a dopant which emits light having a dominant wavelength within a green wavelength range is used. Similar results can be obtained in the case where a dopant which emits light having a dominant wavelength within a different wavelength ranges, for example, a red wavelength range or a blue wavelength range.

For example, in the case where a material having a sublimation point SP2 of 350° C. was used as an example of a dopant emitting light having a dominant wavelength within a red wavelength range and the evaporation temperature was set at 400° C., the chromaticity coordinate Ry was 0.34. In the case where a material having a sublimation point SP2 of 300° C. was used as an example of a dopant emitting light having a dominant wavelength within a blue wavelength range and the evaporation temperature was set at 350° C., the chromaticity coordinate By was 0.12.

Note that the first wavelength range is defined as a wavelength range of 595 to 800 nm, and red is defined as a color of light having a dominant wavelength within the first wavelength range. The second wavelength range is defined as a wavelength range longer than 490 nm and shorter than 595 nm, and green is defined as a color of light having a dominant wavelength within the second wavelength range. Further, the third wavelength range is defined as a wavelength range of 400 to 490 nm, and blue is defined as a color of light having a dominant wavelength within the third wavelength range.

The second manufacturing method utilizing the production apparatus 1 will be described below.

In the second manufacturing method, a substrate SUB on which electrodes PE and a hole-transporting layer are formed is prepared. The substrate SUB is held by the holder 3 with the hole-transporting layer face-down.

Then, the shutter 6 is opened to supply the evaporation material from the feeder 4 into the heating chamber 5. The shutter 6 is closed, for example, after a predetermined amount of the evaporation material is supplied from the feeder 4 to the heating chamber 5.

In the heating chamber 5, the evaporation material is heated to a temperature equal to or higher than the temperature at which the first and second organic materials sublime. For example, the evaporation material is heated to the sublimation point SP2 or higher. Note that in this period, the valve 7 is kept closed in order to shut off a flow of gas from the heating chamber 5 into the nozzle 9.

Heating the evaporation material to the sublimation point SP2 or higher will sublimate the first and second organic materials. Since the shutter 6 and the valve 7 are closed, the internal pressure of the heating chamber may increase as the first and second organic materials sublime. In order to avoid this, a check valve may be attached to the heating chamber 5 so as to exhaust the excess gas from the heating chamber 5.

In this method, the period during which the first and/or second organic materials sublime is divided into first to third periods.

The first period starts at the same time as the sublimation of the first organic starts. The first period is a period that the sublimation rate SR1 of the first organic material is zero or more and the sublimation rate SR2 of the second organic material is lower than the first rate, for example, a period during which only the first organic material sublimes. Alternatively, the first period is a period that a ratio SR2/SR1 of the sublimation rate SR2 of the second organic material with respect to the sublimation rate SR1 of the first organic material is smaller than the first ratio. During the first period, the valve 7 is kept closed.

The second period following the first period is a period that the sublimation rate SR2 of the second organic material is equal to or higher than the first rate and the sublimation rate SR1 of the first organic material is equal to or higher than the second rate. Alternatively, the second period is a period that the ratio SR2/SR1 is equal to or greater than the first ratio and smaller than the second ratio. During the second period, the valve is opened first to supply the sublimed first and second organic materials from the heating chamber 5 to the nozzle 9. The nozzle 9 ejects the sublimed first and second organic materials toward the substrate SUB. A mixture of the first and second organic materials is deposited on the substrate SUB.

The third period following the second period is a period that the sublimation rate SR1 of the first organic material is lower than the second rate and the sublimation rate SR2 of the second organic material is equal to or higher than zero, for example, a period during which only the second organic material sublimes. Alternatively, the third period is a period that the ratio SR2/SR1 is equal to or greater than the second ratio. During the third period, the valve 7 is closed first in order not to supply the first and second organic materials from the heating chamber 5 into the nozzle 9. The valve 7 is kept closed at least until the sublimation of the second organic material is completed.

The emitting layer EML is thus obtained. Then an electron-transporting layer ETL and an electrode CE are formed on the emitting layer EML in this order. Subsequently, downstream operations such as sealing are performed as necessary. An organic EL device is manufactured as described above.

An example of the second manufacturing method will be described with reference to FIG. 6.

FIG. 6 is a graph showing an example of timing to close and open the valve 7. In FIG. 6, the curve H indicates the amount of the sublimed host material, while the curve D indicates the amount of the sublimed dopant.

In this example, only the host material sublimes during the first period T1. During the first period T1, valve 7 is kept closed and thus the substrate SUB cannot be supplied with the host material.

During the second period T2 following the first period T1, the host material and the dopant sublime. During the second period T2, the valve 7 is kept open. Therefore, the substrate SUB is supplied with both the host material and the dopant.

During the third period T3 following the second period T2, only the dopant sublimes. During the third period, the valve 7 is kept closed and thus the substrate SUB cannot be supplied with the dopant.

As above, in the second manufacturing method, the sublimed organic materials are supplied to the substrate SUB only during the period that the sublimation rate SR2 of the second organic material is equal to or higher than the first rate and the sublimation rate SR1 of the first organic material is equal to or higher than the second rate or the period that the ratio SR2/SR1 is equal to or greater than the first ratio and smaller than the second ratio. Therefore, an emitting layer EML having a uniform composition can be obtained. That is, the electron-hole injection balance can be optimized, and a high luminous efficiency can be achieved.

In the second manufacturing method, the heating temperature for the evaporation material in the heating chamber 5 is not limited as long as the first and second organic materials can sublime. The heating temperature may be set higher than the sublimation point SP2 of the second organic material by 50° C. or more as described for the first manufacturing method.

The third manufacturing method utilizing the production apparatus 1 will be described below.

In the third manufacturing method, a substrate SUB on which electrodes PE and a hole-transporting layer are formed is prepared. The substrate SUB is held by the holder 3 with the hole-transporting layer face-down.

Then, the shutter 6 is opened to supply the first evaporation material from the feeder 4 into the heating chamber 5. The first evaporation material includes the second organic material and optionally the first organic material. The valve 7 may be opened before or after opening the shutter 6. Alternatively the valve 7 may be opened simultaneously with the opening of the shutter 6. Alternatively, the valve 7 may be kept open over the film-formation period and the waiting period.

In the heating chamber 5, the first evaporation material is heated to a temperature equal to or higher than the temperature at which the first and second organic materials of the second evaporation material described later sublime. For example, the first evaporation material is heated to the sublimation point T2 or higher. This allows the sublimed first evaporation material to be deposited on the substrate SUB.

Next, the second evaporation material is supplied from the feeder 4 into the heating chamber 5. The second evaporation material includes the first and second organic materials. The concentration of the first organic material in the second evaporation material is higher than the concentration of the first organic material in the first evaporation material.

In the heating chamber 5, the second evaporation material is heated to a temperature equal to or higher than the temperature at which the first and second organic materials of the second evaporation material sublime. For example, the second evaporation material is heated to the sublimation point T2 or higher. This allows the sublimed second evaporation material to be deposited on the substrate SUB.

The emitting layer EML is thus obtained. Then an electron-transporting layer ETL and an electrode CE are formed on the emitting layer EML in this order. Subsequently, downstream operations such as sealing are performed as necessary. An organic EL device is manufactured as described above.

An example of the third manufacturing method will be described with reference to FIG. 7.

FIG. 7 is a graph showing an example of timing to supply the first and second evaporation materials. In FIG. 7, the curve H indicates the amount of the sublimed host material, while the curves D1 and D2 indicate the amount of the sublimed dopant of the first evaporation material and the amount of the sublimed dopant of the second evaporation material, respectively.

FIG. 7 shows an example of a method that can be utilized when the first evaporation material is the second organic material and the second evaporation material is a mixture of the first and second organic materials.

In this example, the first evaporation material is supplied into the heating chamber at the time point A, while the second evaporation material is supplied into the heating chamber at the time point B.

Only the second organic material of the first evaporation material sublimes before supplying the second evaporation material to the heating chamber. When the second evaporation material is supplied to the heating chamber, the sublimation of the first organic material starts before the start of the sublimation of the second organic material included in the second evaporation material. Then, the sublimation of the second organic material included in the second evaporation material starts. Thereafter, the sublimation of the first organic material is completed and only the first organic material sublimes.

Therefore, an emitting layer EML having a relatively uniform composition can be obtained by appropriately set the amount and composition of the first evaporation material and the elapsed time from the time point A to the time point B, etc. That is, the electron-hole injection balance can be optimized, and a high luminous efficiency can be achieved.

In the third manufacturing method, the heating temperature for the evaporation material in the heating chamber 5 is not limited as long as the first and second evaporation materials can sublime. The heating temperature may be set higher than the sublimation point SP2 of the second organic material by 50° C. or more as described for the first manufacturing method.

Described above are the cases where the evaporation material is composed of two components, that is, the host material and the dopant. The components of the evaporation material may be other combinations. Alternatively, the evaporation material may include three or more components. For example, the evaporation material may include two or more dopants.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing an organic EL device, comprising:

providing a structure including a substrate and an electrode positioned above the substrate; and forming an organic layer including a mixture of first and second organic materials above the electrode, the first organic material having a first sublimation point SP1, the second organic material having a second sublimation point SP2 higher than the first sublimation point SP1, and the formation of the organic layer comprising heating an evaporation material including a mixture of the first and second organic materials to an evaporation temperature so as to sublimate the first and second organic materials, the evaporation temperature being one of first to third temperatures, the first temperature being a temperature higher than the second sublimation temperature SP2 by 50° C. or more, the second temperature being equal to or higher than a sum of the first sublimation temperature SP1 and a product of 150/370 and the first sublimation temperature SP1, and the third temperature being equal to or higher than a sum of the second sublimation temperature SP2 and a product of 50/370 and the second sublimation temperature SP2, and delivering the sublimed first and second organic materials toward the electrode to deposit a mixture including the first and second organic materials above the electrode.

2. The method according to claim 1, wherein the evaporation material is in a form of particles.

3. The method according to claim 2, wherein the heating of the evaporation material includes supplying the evaporation material into a heating chamber, and heating the evaporation material in the heating chamber to the evaporation temperature.

4. The method according to claim 3, wherein the heating chamber is spaced apart from a space below the structure, and the delivery of the first and second organic materials toward the electrode includes supplying the sublimed first and second organic materials from the heating chamber to a nozzle, the nozzle being placed in the space and configured to eject the sublimed first and second organic materials toward the electrode.

5. The method according to claim 4, wherein the structure, the heating chamber and the nozzle are arranged in a chamber.

6. The method according to claim 5, herein the evaporation material is supplied into the heating chamber from above.

7. The method according to claim 3, wherein a flow of gas from the heating chamber to the substrate is shut off during a period after starting the supplying of the evaporation material into the heating chamber and before the sublimation of the second organic material starts, and the sublimed first and second organic materials are supplied to the substrate after the sublimation of the second organic material in the heating chamber starts.

8. The method according to claim 3, wherein the supplying of the evaporation material into the heating chamber includes:
supplying a first evaporation material into the heating chamber, the first evaporation material including the second organic material and optionally the first organic material; and
thereafter supplying a second evaporation material into the heating chamber, the second evaporation material including the first and second materials, the second evaporation material having a concentration of the first organic material higher than that of the first evaporation material.

9. The method according to claim 1, wherein the evaporation temperature is the first temperature.

10. The method according to claim 1, wherein the first organic material is a host material and the second organic material is a dopant.

11. The method according to claim 1, wherein the evaporation material includes two or more dopants.

12. A method of manufacturing an organic EL device, comprising:
providing a structure including a substrate and an electrode positioned above the substrate; and
forming an organic layer including a mixture of first and second organic materials above the electrode, the first organic material having a first sublimation point SP1, the second organic material having a second sublimation point SP2 higher than the first sublimation point SP1, and the formation of the organic layer comprising
supplying an evaporation material including a mixture of the first and second organic materials into a heating chamber,
heating the evaporation material in the heating chamber to sublimate the first and second organic materials,
keeping a flow of gas from the heating chamber toward the electrode shut off during a period after starting the supplying of the evaporation material into the heating chamber and before the sublimation of the second organic material starts, and
delivering the sublimed first and second organic materials toward the electrode after the sublimation of the second organic material in the heating chamber starts so as to deposit a mixture including the first and second organic materials above the electrode.

13. The method according to claim 12, wherein the evaporation material is in a form of particles.

14. The method according to claim 13, wherein the heating chamber is spaced apart from a space below the structure, and the delivery of the first and second organic materials toward the electrode includes supplying the sublimed first and second organic materials from the heating chamber to a nozzle, the nozzle being placed in the space and configured to eject the sublimed first and second organic materials toward the electrode.

15. The method according to claim 12, wherein the structure, the heating chamber and the nozzle are arranged in a chamber.

16. The method according to claim 15, herein the evaporation material is supplied into the heating chamber from above.

17. The method according to claim 12, wherein the first organic material is a host material and the second organic material is a dopant.

18. The method according to claim 12, wherein the evaporation material includes two or more dopants.

19. A method of manufacturing an organic EL device, comprising:
providing a structure including a substrate and an electrode positioned above the substrate; and
forming an organic layer including a mixture of first and second organic materials above the electrode, the first organic material having a first sublimation point SP1, the second organic material having a second sublimation point SP2 higher than the first sublimation point SP1, and the formation of the organic layer comprising
supplying an evaporation material including a mixture of the first and second organic materials into a heating chamber,
heating the evaporation material in the heating chamber to sublimate the first and second organic materials, and
delivering the sublimed first and second organic materials toward the electrode so as to deposit a mixture including the first and second organic materials above the electrode, wherein the supplying of the evaporation material into the heating chamber includes
supplying a first evaporation material into the heating chamber, the first evaporation material including the second organic material and optionally the first organic material, and
thereafter supplying a second evaporation material into the heating chamber, the second evaporation material including the first and second materials, the second evaporation material having a concentration of the first organic material higher than that of the first evaporation material.

20. The method according to claim 19, wherein the first organic material is a host material and the second organic material is a dopant.

* * * * *